(12) United States Patent
Chen et al.

(10) Patent No.: US 12,300,630 B2
(45) Date of Patent: May 13, 2025

(54) SEMICONDUCTOR DEVICE PACKAGE STRUCTURE COMPRISING PACKAGE UNIT INCLUDING ADHESIVE LAYER

(71) Applicant: Advanced Semiconductor Engineering, Inc., Kaohsiung (TW)

(72) Inventors: Ming-Hung Chen, Kaohsiung (TW); Zheng Wei Wu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 18/212,162

(22) Filed: Jun. 20, 2023

(65) Prior Publication Data
US 2023/0335505 A1    Oct. 19, 2023

Related U.S. Application Data

(63) Continuation of application No. 17/346,068, filed on Jun. 11, 2021, now Pat. No. 11,682,631.

(51) Int. Cl.
| | | |
|---|---|---|
| *H01L 23/552* | (2006.01) | |
| *H01L 21/50* | (2006.01) | |
| *H01L 21/768* | (2006.01) | |
| *H01L 21/78* | (2006.01) | |
| *H01L 23/00* | (2006.01) | |

(Continued)

(52) U.S. Cl.
CPC ............ *H01L 23/552* (2013.01); *H01L 21/50* (2013.01); *H01L 21/768* (2013.01); *H01L 21/78* (2013.01); *H01L 24/14* (2013.01); *H01L 2924/3025* (2013.01)

(58) Field of Classification Search
CPC .......... H01L 23/552; H01L 2924/3025; H01L 21/50; H01L 21/768; H01L 24/14; H01L 2224/16227; H01L 2224/81; H01L 24/13; H01L 2924/18161; H01L 2224/95; H01L 23/3135; H01L 23/3128;

(Continued)

(56) References Cited

U.S. PATENT DOCUMENTS

| | | | |
|---|---|---|---|
| 9,627,228 B1 | 4/2017 | Chen et al. | |
| 2003/0052419 A1* | 3/2003 | Ujiie | H01L 24/83 |
| | | | 257/784 |

(Continued)

OTHER PUBLICATIONS

Non-Final Office Action for U.S. Appl. No. 17/346,068, issued Sep. 29, 2022, 15 pages.

(Continued)

*Primary Examiner* — Didarul A Mazumder
(74) *Attorney, Agent, or Firm* — FOLEY & LARDNER LLP

(57) ABSTRACT

The present disclosure provides a semiconductor device package including a substrate having a first surface and a second surface opposite to the first surface, a first package body disposed on the first surface, and a conductive layer covering the first package body and the substrate. The conductive layer includes a first portion on the top surface of the first package body and a second portion on the lateral surface of the first package body and a sidewall of the substrate. The second portion of the conductive layer has a tapered shape. A method for manufacturing a semiconductor device package is also provided.

19 Claims, 10 Drawing Sheets

(51) Int. Cl.
*H01L 23/31* (2006.01)
*H01L 25/065* (2023.01)

(58) Field of Classification Search
CPC ....... H01L 2924/19105; H01L 25/0652; H01L 21/78; B04B 7/14; B04B 1/08
USPC ........................................................ 257/659
See application file for complete search history.

(56) References Cited

U.S. PATENT DOCUMENTS

| | | |
|---|---|---|
| 2012/0300412 A1 | 11/2012 | Song et al. |
| 2016/0035680 A1 | 2/2016 | Wu |
| 2016/0351509 A1 | 12/2016 | Dang et al. |
| 2017/0005042 A1* | 1/2017 | Chen .................... H01L 23/552 |
| 2017/0141046 A1 | 5/2017 | Jeong et al. |
| 2017/0345770 A1 | 11/2017 | Chien |
| 2018/0138155 A1* | 5/2018 | Kim .................... H01L 25/0657 |
| 2018/0323170 A1* | 11/2018 | Kim ....................... H01L 23/31 |
| 2021/0375707 A1* | 12/2021 | Teixeira de Queiros ................... H01L 23/315 |

OTHER PUBLICATIONS

Notice of Allowance for U.S. Appl. No. 17/346,068, issued Feb. 6, 2023, 10 pages.

* cited by examiner

SEMICONDUCTOR DEVICE PACKAGE STRUCTURE COMPRISING PACKAGE UNIT INCLUDING ADHESIVE LAYER

CROSS-REFERENCE TO RELATED APPLICATION

This application is a continuation of U.S. patent application Ser. No. 17/346,068, filed Jun. 11, 2021, the contents of which is incorporated herein by reference in its entirety.

BACKGROUND

1. Technical Field

The present disclosure generally relates to a semiconductor device package and a method for manufacturing a semiconductor device package.

2. Description of the Related Art

In the current process of forming an electromagnetic interference (EMI) shielding layer on a package, a thermal stable tape may be utilized for the package's ball/pad side protection. A part of the ball/pad side may be in contact with the thermal stable tape, which means the package's lateral surface may partially contact the thermal stable tape. Therefore, the package's lateral surface may not be fully covered by the EMI shielding layer. After the thermal stable tape is removed, the EMI shielding layer may split from the package, forming burrs on the edges. The burrs may cause particle contamination and may also cause short-circuits.

SUMMARY

In some embodiments, a semiconductor device package includes a substrate having a first surface and a second surface opposite to the first surface, a first package body disposed on the first surface, and a conductive layer covering the first package body and the substrate. The conductive layer includes a first portion on the top surface of the first package body and a second portion on the lateral surface of the first package body and a sidewall of the substrate. The second portion of the conductive layer has a tapered shape.

In some embodiments, a method for manufacturing a semiconductor device package includes providing a substrate having a first surface and a second surface opposite to the first surface. A first package body is disposed on the first surface. The method also includes forming a sacrificial layer on the second surface of the substrate, attaching the substrate and the first package body to a carrier through the sacrificial layer, and forming a conductive layer to cover the first package body and the sacrificial layer.

BRIEF DESCRIPTION OF THE DRAWINGS

Aspects of the present disclosure are readily understood from the following detailed description when read with the accompanying figures. It should be noted that various features may not be drawn to scale. The dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
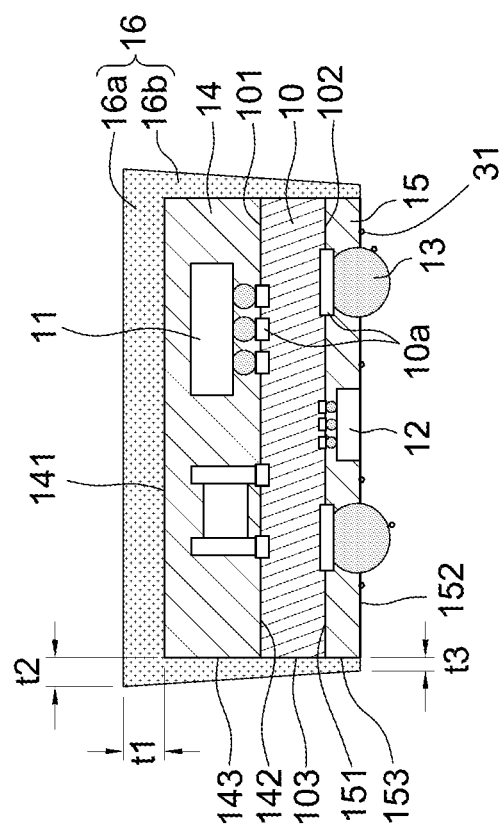
FIG. 1A illustrates a cross-sectional view of a semiconductor device package, in accordance with an embodiment of the present disclosure.

The following disclosure provides for many different embodiments, or examples, for implementing different features of the provided subject matter. Specific examples of components and arrangements are described below. These are, of course, merely examples and are not intended to be limiting. In the present disclosure, a reference to the formation of a first feature over or on a second feature in the description that follows may include embodiments in which the first and second features are formed in direct contact, and may also include embodiments in which additional features may be formed between the first and second features, such that the first and second features may not be in direct contact. Besides, the present disclosure may repeat reference numerals and/or letters in the various examples. This repetition is for simplicity and clarity and does not in itself dictate a relationship between the various embodiments and/or configurations discussed.

Embodiments of the present disclosure are discussed in detail below. It should be appreciated, however, that the present disclosure provides many applicable concepts that can be embodied in a wide variety of specific contexts. The specific embodiments discussed are merely illustrative and do not limit the scope of the disclosure.

FIG. 1A illustrates a cross-sectional view of a semiconductor device package 1, in accordance with an embodiment of the present disclosure. The semiconductor device package 1 may include a substrate 10, electronic devices 11, 12, a conductive terminal 13, package bodies 14, 15, and a conductive layer 16.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure, such as a redistribution layer (RDL), through via, or core structure. The RDL may include a fanout-type RDL. The core structure may include bismaleimide-triazine (BT) resin, pre-preg, Ajinomoto built-up film (ABF), Polyimide (PI), polybenzoxazole (PBO), solder resist, silicon, glass, ceramic, or a combination or two or more thereof. In some embodiments, the substrate 10 may include a coreless substrate or a build-up substrate. The substrate 10 may have a surface 101 (which may also be referred to as a first surface), a surface 102 (which may also be referred to as a second surface) opposite to the surface 101, and a surface 103 (which may also be referred to as a lateral surface) extending between the surface 101 and the surface 102. The substrate 10 may include one or more conductive pads 10a in proximity to, adjacent to, or embedded in and exposed at the surface 101 and/or the surface 102 of the substrate 10. The substrate 10 may include a solder resist (not shown in the figures) on the surface 101 and/or the surface 102 to fully expose or to expose at least a portion of the conductive pads 10a for electrical connections.

The electronic device 11 may be disposed on the surface 101 of the substrate 10. The electronic device 11 may be electrically connected to one or more other electrical components and to the substrate 10 (e.g., to the interconnection structure), and the electrical connection may be attained by way of flip-chip, wire-bond techniques, metal to metal bonding (such as Cu to Cu bonding), or hybrid bonding.

In some embodiments, the electronic device 11 may be a chip or a die including a semiconductor substrate, one or more integrated circuit devices and one or more overlying interconnection structures therein. The integrated circuit devices may include active devices such as transistors and/or passive devices such as resistors, capacitors, inductors, or a combination thereof.

The electronic device 12 may be disposed on the surface 102 of the substrate 10. The electronic device 12 may have a similar structure and arrangement as the electronic device 11, and the similar description is omitted hereafter for the purpose of simplicity and clarity.

The package body 14 may be formed on the surface 101 of the substrate 10 to encapsulate the electronic device 11. The package body 14 may have a surface 141 (which may also be referred to as a top surface), a surface 142 (which may also be referred to as a bottom surface) opposite to the surface 141, and a surface 143 (which may also be referred to as a lateral surface) extending between the surface 141 and the surface 142. The surface 141 may face away from the substrate 10. The surface 142 may face the substrate 10. The surface 142 may be in contact with the surface 101 of the substrate 10. The surface 143 may be substantially coplanar with the surface 103 of the substrate 10.

In some embodiments, the package body 14 may include an epoxy resin having fillers, a molding compound (e.g., an epoxy molding compound or other molding compound), a polyimide, a phenolic compound or material, a material with a silicone dispersed therein, or a combination thereof.

The package body 15 may be formed on the surface 102 of the substrate 10 to encapsulate the electronic device 12. For example, the electronic device 12 may be entirely or partially covered by the package body 15. The package body 15 may have a surface 151 (which may also be referred to as a bottom surface), a surface 152 (which may also be referred to as a top surface) opposite to the surface 151, and a surface 153 (which may also be referred to as a lateral surface) extending between the surface 151 and the surface 152. The surface 152 may face away from the substrate 10. The surface 151 may face the substrate 10. The surface 151 may be in contact with the surface 102 of the substrate 10. The surface 153 may be substantially coplanar with the surface 103 of the substrate 10. In some embodiments, the package body 15 may be omitted.

The package body 15 may include one or more materials as listed above for the package body 14. In some embodiments, the package body 14 and the package body 15 may include the same material. In some embodiments, the material of the package body 15 may be different from the material of the package body 14.

The conductive terminal 13 (e.g., a solder ball) may be disposed on the surface 102 of the substrate 10 and can provide electrical connections between the semiconductor device package 1 and external components (e.g., external circuits or circuit boards). In some embodiments, the conductive terminal 13 may be at least partially exposed from the package body 15.

In some embodiments, the conductive terminal 13 may include a controlled collapse chip connection (C4) bump, a ball grid array (BGA) or a land grid array (LGA).

The conductive layer 16 may be disposed on one or more outer surfaces of the semiconductor device package 1. In some embodiments, the conductive layer 16 may be in contact with one or more outer surfaces of the semiconductor device package 1. In some embodiments, the conductive layer 16 may directly contact one or more outer surfaces of the semiconductor device package 1.

For example, as shown in FIG. 1A, the conductive layer 16 may have a portion 16a disposed on the surface 141 of the package body 14 and a portion 16b connected with the portion 16a. The portion 16a may be in contact with (such as directly contacting) the surface 141 of the package body 14. The portion 16a may cover or encapsulate the surface 141 of the package body 14.

The portion 16b may be disposed on the surface 143 of the package body 14, the surface 103 of the substrate 10, and the surface 153 of the package body 15. The portion 16b may be continuously disposed on the surface 143 of the package body 14, the surface 103 of the substrate 10, and the surface 153 of the package body 15. The portion 16b may be in contact with (such as directly contacting) the surface 143 of the package body 14, the surface 103 of the substrate 10, and the surface 153 of the package body 15. The portion 16b may cover or encapsulate the surface 143 of the package body 14, the surface 103 of the substrate 10, and the surface 153 of the package body 15. The portion 16b may fully cover or encapsulate the surface 143 of the package body 14, the surface 103 of the substrate 10, and the surface 153 of the package body 15. For example, the surface 143 of the package body 14 may be entirely covered by the portion 16b. For example, the surface 103 of the substrate 10 may be entirely covered by the portion 16b. For example, the surface 153 of the package body 15 may be entirely covered by the portion 16b.

The conductive layer 16 may surround the electronic device 11 and the electronic device 12. The conductive layer 16 may provide an electromagnetic interference (EMI) protection to prevent the electronic device 11 and the electronic device 12 from being interfered with by other electronic components, and vice versa. In some embodiments, the conductive layer 16 may be connected to ground.

In some embodiments, the conductive layer 16 may include copper (Cu) or other conductive materials, such as aluminum (Al), chromium (Cr), tin (Sn), gold (Au), silver (Ag), nickel (Ni) or stainless steel, another metal, or a mixture, an alloy, or other combinations of two or more thereof. In some embodiments, the conductive layer 16 may be a conductive thin film.

In some embodiments, the portion 16a of the conductive layer 16 may be substantially planar. In some embodiments, the portion 16a of the conductive layer 16 may have a consistent thickness. For example, the thickness "t1" measured along a direction perpendicular to the surface 141 of the package body 14 may be substantially the same.

In some embodiments, the thickness of the portion 16b of the conductive layer 16 may gradually change. In some embodiments, the thickness of the portion 16b of the conductive layer 16 may be not constant. In some embodiments, the portion 16b of the conductive layer 16 may taper. In some embodiments, the portion 16b of the conductive layer 16 may taper from the surface 141 of the package body 14 toward the surface 142 of the package body 14. For example, the thickness of the portion 16b closer to the surface 142 of the package body 14 may be substantially less than the thickness of the portion 16b closer to the surface 141 of the package body 14. For example, the thickness of the portion 16b closer to the substrate 10 may be substantially less than the thickness of the portion 16b closer to the portion 16a. The thickness of the portion 16b closer to the package body 15 may be substantially less than the thickness of the portion 16b closer to the substrate 10.

For example, the portion 16b of the conductive layer 16 may have thicknesses "t2" and "t3" measured in a direction perpendicular to the surface 143 of the package body 14. The thickness t2 is closer to the surface 141 of the package body 14 and is greater than the thickness t3.

In some embodiments, the portion 16b of the conductive layer 16 may have a thickness (measured in a direction perpendicular to the surface 143 of the package body 14) substantially the same as the thickness t1 of the portion 16a of the package body 14.

In some embodiments, the portion 16b of the conductive layer 16 may have a thickness (measured in a direction perpendicular to the surface 143 of the package body 14) substantially half of the thickness t1 of the portion 16a. For example, the ratio of the thickness t1 of the portion 16a to a thickness of the portion 16b of the conductive layer 16 may be about 2.

In some existing approaches to form the conductive layer 16 on one or more outer surfaces of the semiconductor device package 1, a thermal stable tape (such as Polyimides (PI)) may be disposed on the package body 15 to cover the conductive terminal 13 to protect the conductive terminal 13.

The package body 15 may be in contact with the thermal stable tape due to surface wetting or an external force applied from, for example, a roll laminator. A part of the surface 153 may at least partially contact the thermal stable tape. Therefore, the surface 153 may not be fully covered by the conductive layer 16 through, for example, sputtering operations or spray coating operations. After the thermal stable tape is removed, the conductive layer 16 may split from the surface 153, forming burrs on the edges. The burrs may cause particle contamination and may also cause short-circuits.

Figure 4A:
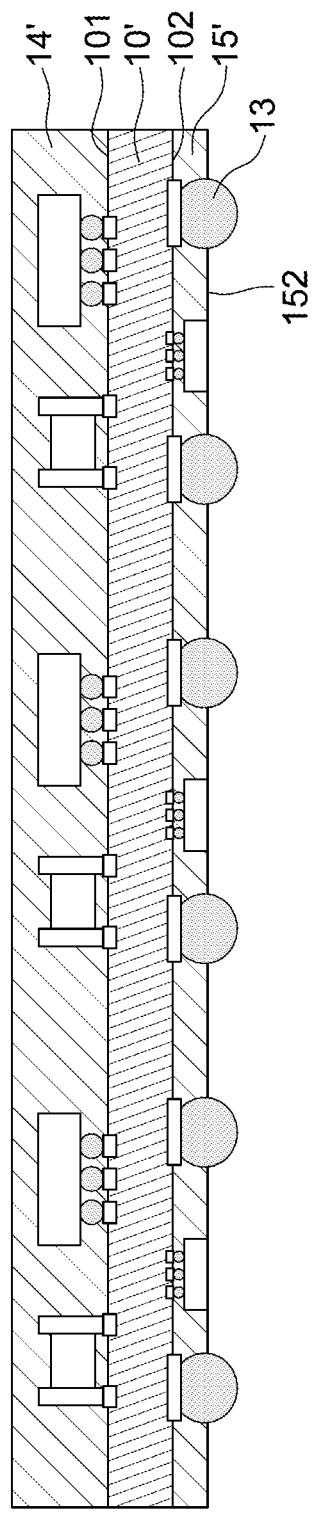
FIG. 4A illustrates a cross sectional view during one or more stages of a method for manufacturing a semiconductor device package in accordance with some embodiments of the present disclosure.
Figure 4B:
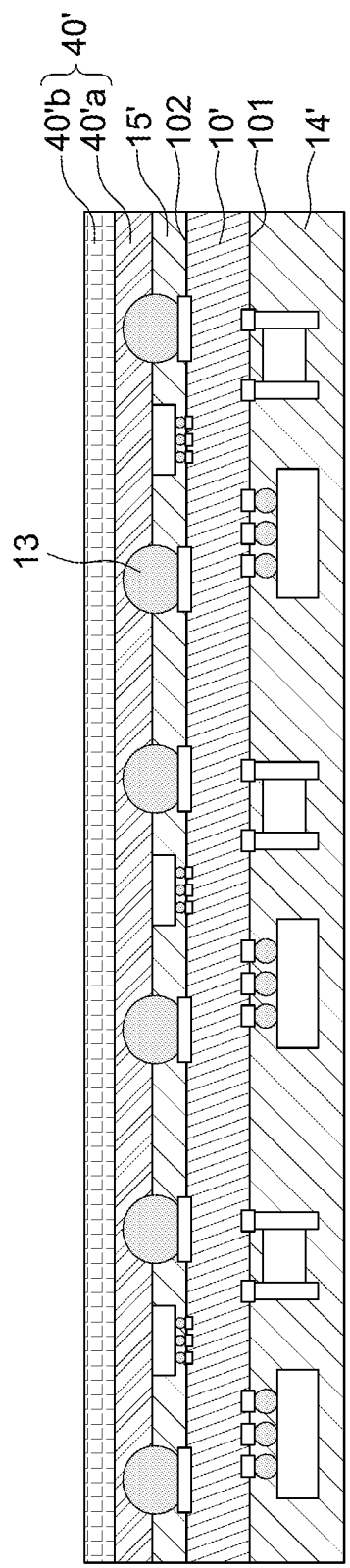
FIG. 4B illustrates a cross-sectional view during one or more stages of a method for manufacturing a semiconductor device package in accordance with some embodiments of the present disclosure.
Figure 4C:
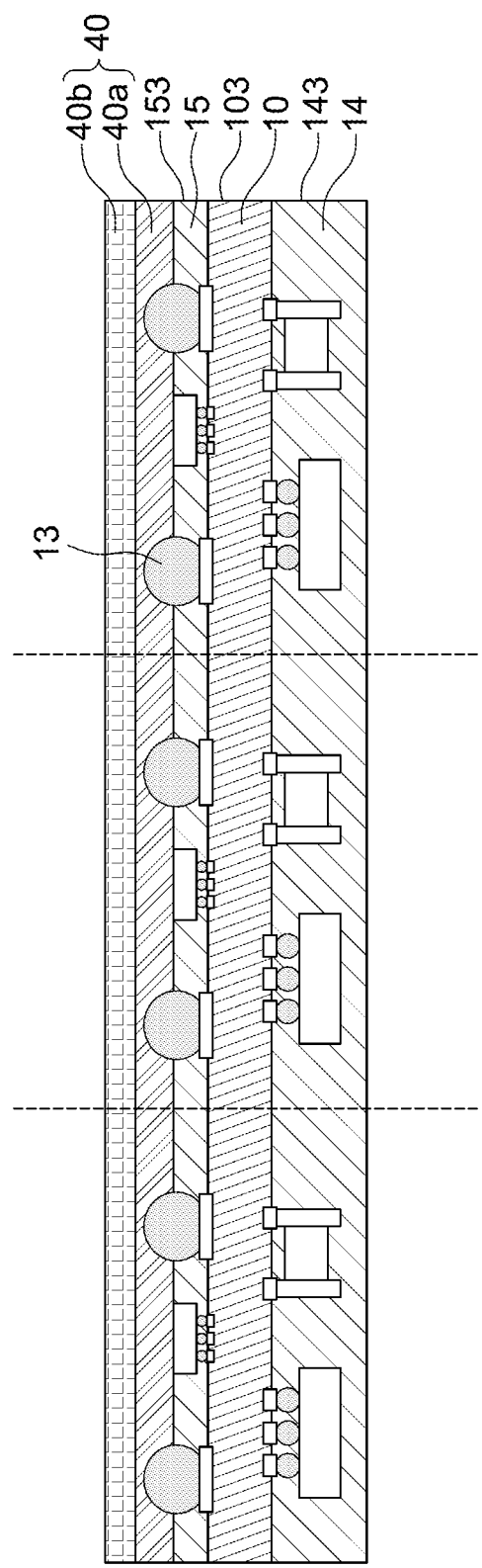
FIG. 4C illustrates a cross-sectional view during one or more stages of a method for manufacturing a semiconductor device package in accordance with some embodiments of the present disclosure.
Figure 4D:
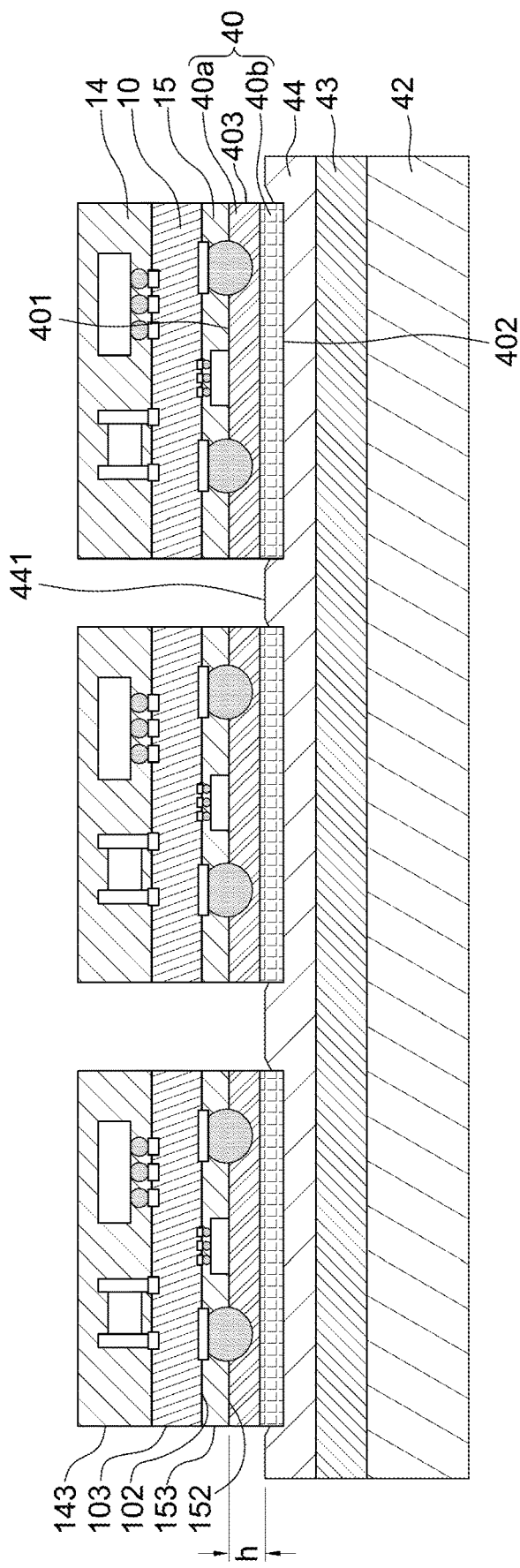
FIG. 4D illustrates a cross-sectional view during one or more stages of a method for manufacturing a semiconductor device package in accordance with some embodiments of the present disclosure.
Figure 4E:
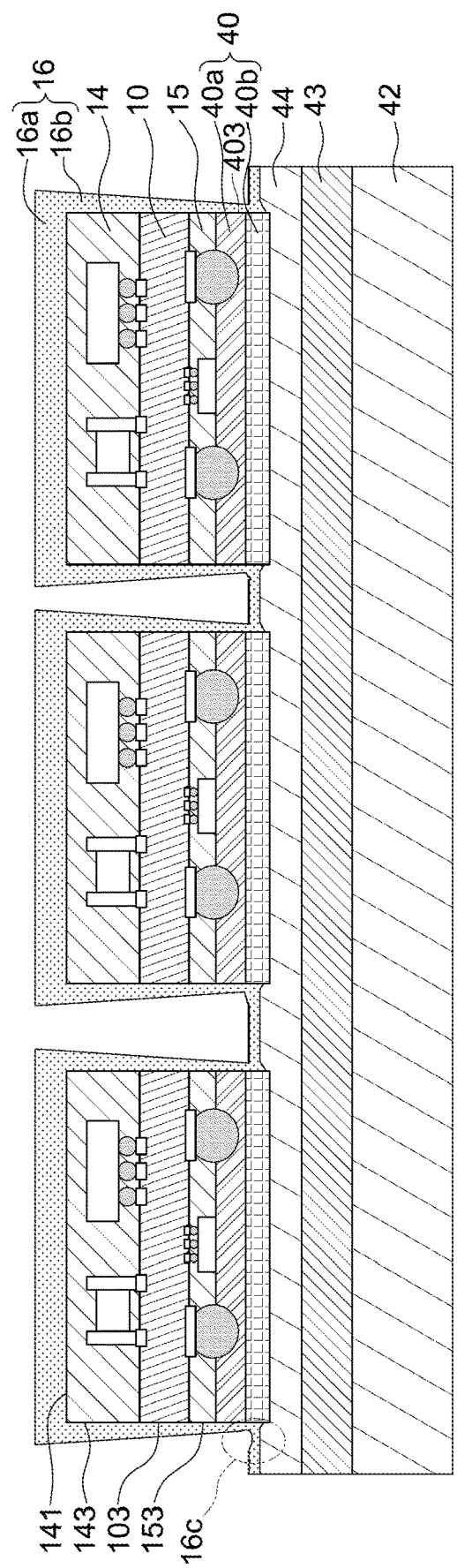
FIG. 4E illustrates a cross-sectional view during one or more stages of a method for manufacturing a semiconductor device package in accordance with some embodiments of the present disclosure.

By comparison, in the present disclosure, a sacrificial layer (such as a sacrificial layer 40' in FIG. 4B) is used to raise up the package body 15, and the surface 153 is fully exposed to air during sputtering operations or spray coating operations (as shown in FIG. 4D and FIG. 4E). For example, in FIG. 4D, the surface 152 of the package body 15 is raised up by the sacrificial layer 40 and is spaced apart from the adhesive layer 44 by a distance "h." Therefore, the surface 153 is not in contact with the adhesive layer 44. The surface 102 or the surface 103 of the substrate 10 is even higher than the surface 152 or the surface 153 of the package body 15 and thus is higher than a top surface 441 of the adhesive layer 44, rendering no contact with the adhesive layer 44. In FIG. 4E, the conductive layer 16 can fully cover the surface 153.

In addition, in some embodiments, since the adhesive force between the conductive layer 16 and the surface 153 is greater than the adhesive force between the conductive layer 16 and the sacrificial layer 40, the conductive layer 16 may break on the boundary of the sacrificial layer 40. After the adhesive layer 44 and the sacrificial layer 40 are removed in FIG. 4F, the conductive layer 16 may stick to the surface 153. Therefore, the burr formation can be prevented.

Figure 4F:
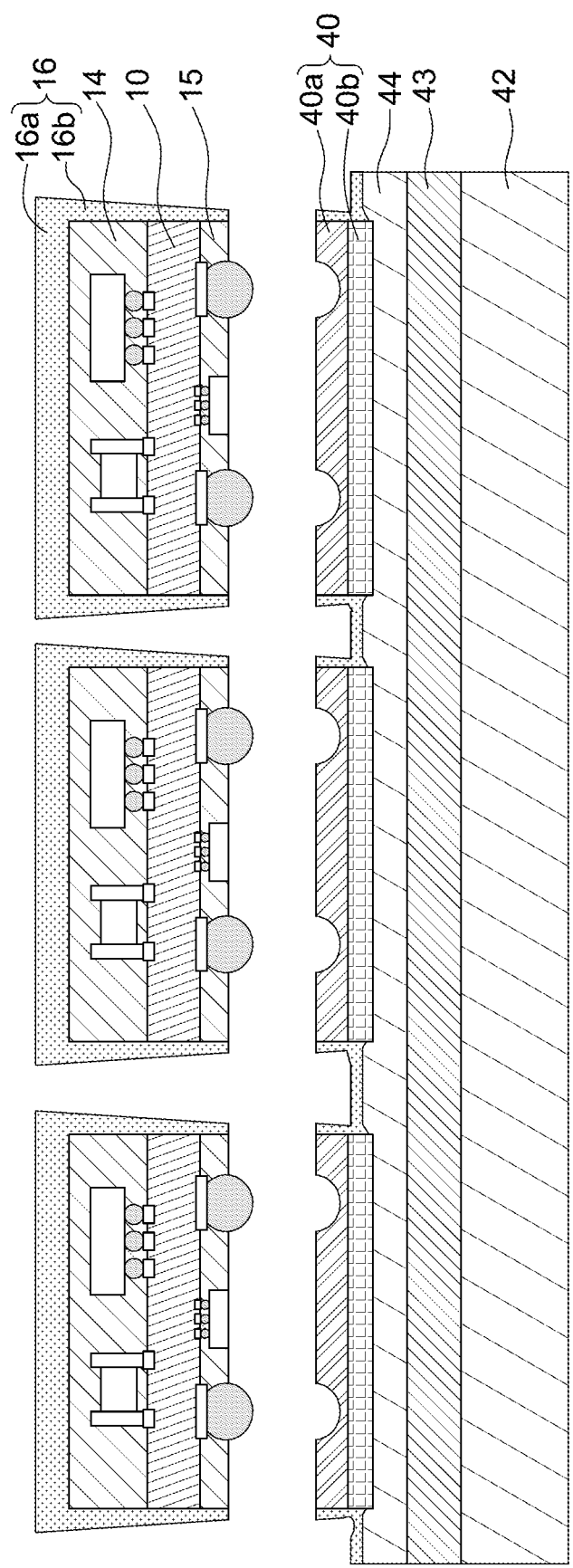
FIG. 4F illustrates a cross-sectional view during one or more stages of a method for manufacturing a semiconductor device package in accordance with some embodiments of the present disclosure.

In some embodiments, the sacrificial layer 40 may be composed of thermosetting material or light-activated resin. After the sacrificial layer 40 is removed (as shown in FIG. 4F), residue of the sacrificial layer 40 may be left. For example, adhesive residue or residue 31 may be proximal to the surface 152 of the package body 15. In some embodiments, the residue 31 may in contact with the surface 152 of the package body 15. In some embodiments, the residue 31 may be proximal to the conductive terminal 13. In some embodiments, the residue 31 may in contact with the conductive terminal 13.

Figure 1B:
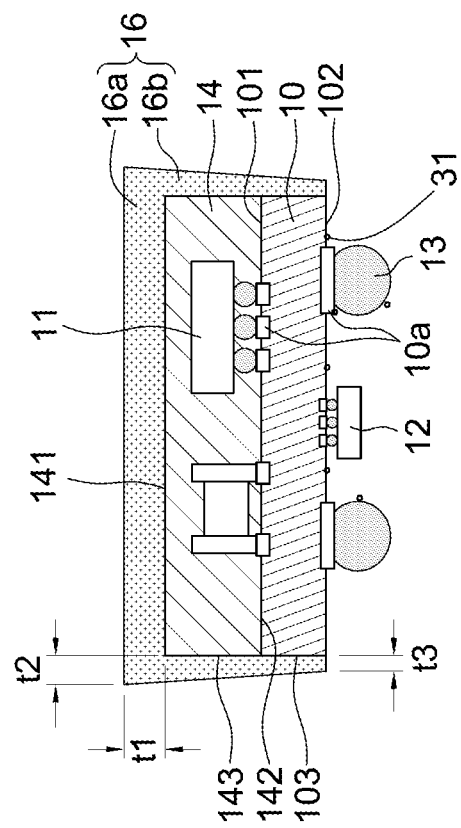
FIG. 1B illustrates a cross-sectional view of a semiconductor device package, in accordance with an embodiment of the present disclosure.

FIG. 1B illustrates a cross-sectional view of a semiconductor device package 1' in accordance with some embodiments of the present disclosure. The semiconductor device package 1' of FIG. 1B is similar to the semiconductor device package 1 of FIG. 1A except that the package body 15 is omitted. In some embodiments, residue 31 may be proximal to the surface 102 of the substrate 10. In some embodiments, the residue 31 may in contact with the surface 102 of the substrate 10. In some embodiments, the residue 31 may be proximal to the conductive terminal 13. In some embodiments, the residue 31 may in contact with the conductive terminal 13. In some embodiments, the residue 31 may be proximal to a corner of the conductive pad 10a and the surface 102 of the substrate 10. In some embodiments, the residue 31 may in contact with a corner of the conductive pad 10a and the surface 102 of the substrate 10.

Figure 2:
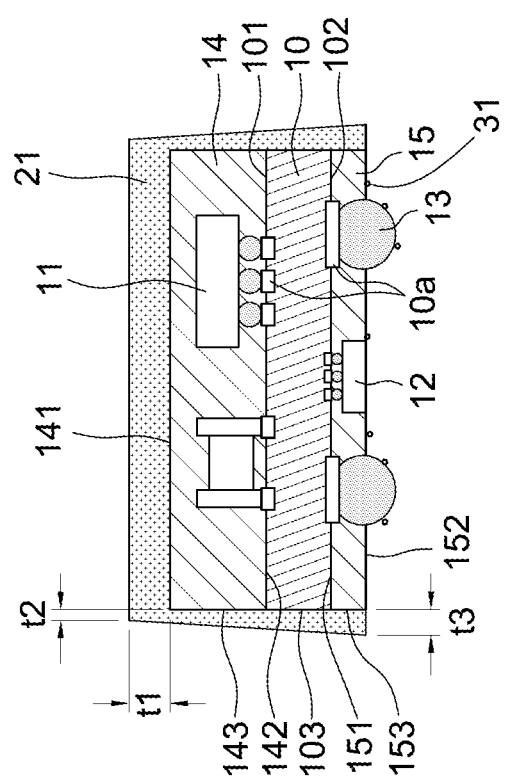
FIG. 2 illustrates a cross-sectional view of a semiconductor device package, in accordance with an embodiment of the present disclosure.

FIG. 2 illustrates a cross-sectional view of a semiconductor device package 2 in accordance with some embodiments of the present disclosure. The semiconductor device package 2 of FIG. 2 is similar to the semiconductor device package 1 of FIG. 1A, and the differences therebetween are described below.

In some embodiments, the portion 16b of the conductive layer 16 may taper from the surface 142 of the package body 14 toward the surface 141 of the package body 14. For example, a thickness of the portion 16b closer to the surface 142 of the package body 14 may be substantially greater than a thickness of the portion 16b closer to the surface 141 of the package body 14. For example, a thickness of the portion 16b closer to the substrate 10 may be substantially greater than a thickness of the portion 16b closer to the portion 16a. A thickness of the portion 16b closer to the package body 15 may be substantially greater than a thickness of the portion 16b closer to the substrate 10. For example, the thickness t2 is closer to the surface 141 of the package body 14 and is less than the thickness t3.

In some embodiments, residue 31 may be proximal to the surface 152 of the package body 15. In some embodiments, the residue 31 may in contact with the surface 152 of the package body 15. In some embodiments, the residue 31 may be proximal to the conductive terminal 13. In some embodiments, the residue 31 may be in contact with the conductive terminal 13.

In some embodiments, the package body 15 may be omitted. In some embodiments, residue 31 may be proximal to the surface 102 of the substrate 10. In some embodiments, the residue 31 may be in contact with the surface 102 of the substrate 10. In some embodiments, the residue 31 may be proximal to the conductive terminal 13. In some embodiments, the residue 31 may be in contact with the conductive terminal 13. In some embodiments, the residue 31 may be proximal to a corner of the conductive pad 10a and the surface 102 of the substrate 10. In some embodiments, the residue 31 may be in contact with a corner of the conductive pad 10a and the surface 102 of the substrate 10.

Figure 3:
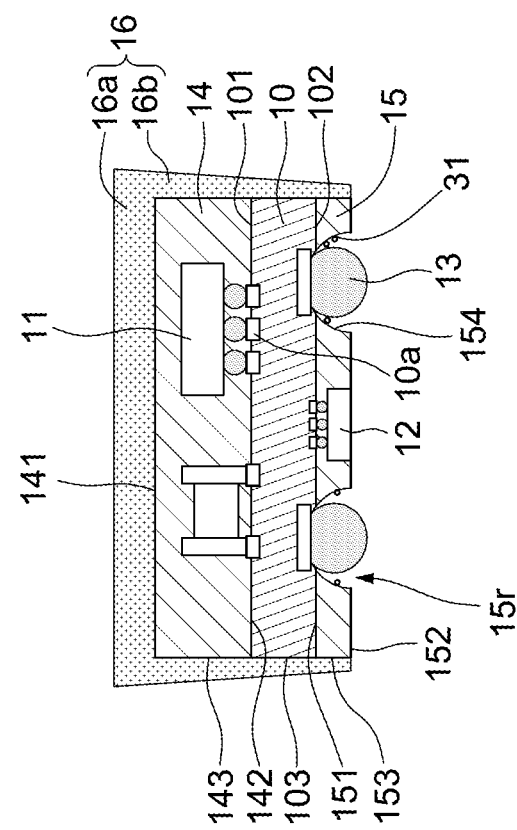
FIG. 3 illustrates a cross-sectional view of a semiconductor device package, in accordance with an embodiment of the present disclosure.

FIG. 3 illustrates a cross-sectional view of a semiconductor device package 3 in accordance with some embodiments of the present disclosure. The semiconductor device package 3 of FIG. 3 is similar to the semiconductor device package 1 of FIG. 1A, and the differences therebetween are described below.

The package body 15 of the semiconductor device package 3 defines a recess 15r recessed from the surface 152. The recess 15r may penetrate the package body 15. The recess 15r may be between the conductive terminal 13 and the package body 15. From the cross-sectional view of FIG. 3, a width of the recess 15r may be uneven or varied. For example, a width of the recess 15r closer to the surface 152 may be substantially greater than a width of the recess 15r closer to the surface 151.

The recess 15r may have a sidewall 154. The conductive terminal 13 may be exposed from the recess 15r and surrounded by the sidewall 154. In some embodiments, a surface roughness of the sidewall 154 may be greater than a surface roughness of the surface 152. For example, a roughness parameter (e.g., Ra, Rz, Rq, etc.) of the sidewall 154 may be greater than a roughness parameter of the surface 152.

In some embodiments, the residue 31 may be proximal to the recess 15r. In some embodiments, the residue 31 may be disposed on the sidewall 154. In some embodiments, the residue 31 may in contact with the sidewall 154. In some embodiments, the residue 31 may be disposed between the package body 15 and the conductive terminal 13. In some embodiments, the residue 31 may include a thermosetting material or light-activated resin. Specifically, examples may include epoxy resin, phenolic formaldehyde (PF) resins, phenolic neoprene, resorcinol formaldehydes (RF), polyesters, and polyimides, other cross-linked polymeric resins, or an equivalent thereof. Specifically, examples may include ultraviolet (UV) curable polymer. Specifically, examples may include epoxy resin having a photo initiator, such as an UV photoinitiator or a visible light photoinitiator.

FIG. 4A, FIG. 4B, FIG. 4C, FIG. 4D, FIG. 4E, and FIG. 4F are cross-sectional views of a semiconductor device package at various stages of fabrication, in accordance with some embodiments of the present disclosure. At least some of these figures have been simplified to better understand the aspects of the present disclosure.

Referring to FIG. 4A, a substrate 10' may be provided. The substrate 10' may have a surface 101 and a surface 102 opposite to the surface 101. One or more electronic devices may be disposed on the 101 and the surface 102. A package body 14' may be disposed on the 101 and a package body 15' may be disposed on the 102.

A conductive terminal 13 (e.g., a solder ball) may be disposed on the surface 102 of the substrate 10' and may be at least partially exposed from a surface 152 of the package body 15'.

In some embodiments, a surface treatment may be performed to the surface 152 to reflow or melt the conductive terminal 13. The surface treatment may include, for example, a plasma treatment, a heat treatment, a laser treatment, a combination thereof, or another suitable treatment. Portions of the package body 15' that surround the conductive terminal 13 may be recessed. After the surface treatment, a recessed portion (such as the recess 15r in FIG. 3) may be defined in the package body 15'. In some embodiments, a surface roughness in the recess 15r in FIG. 3 may be greater than a surface roughness of the surface 152. However, in some embodiments, the package body 15' may be omitted.

Referring to FIG. 4B, a sacrificial layer 40' may be disposed on the package body 15'. In some embodiments, the sacrificial layer 40' may cover the conductive terminal 13. In some embodiments, the sacrificial layer 40' may include a multi-layered structure. In some embodiments, the sacrificial layer 40' may include a curable layer 40'a and a base film 40'b. The curable layer 40'a may include a thermosetting material or light-activated resin, such as the material mentioned above for the residue 31. The curable layer 40'a may be disposed between the package body 15' and the base film 40'b. The base film 40'b may be a carrier for carrying the curable layer 40'a. The base film 40'b may help attach the curable layer 40'a to the adhesive layer 44 in a following operation in FIG. 4D.

In some embodiments where a surface treatment is performed to the surface 152 to reflow or melt the conductive terminal 13, the sacrificial layer 40' may be disposed in the recess 15r in FIG. 3. For example, the sacrificial layer 40' may be placed into the recess 15r in FIG. 3. For example, the recess 15r in FIG. 3 may be filled up with the sacrificial layer 40'. In some embodiments where the package body 15' is omitted, the sacrificial layer 40' may be disposed on the surface 102 of the substrate 10.

In some embodiments, a curing operation may be performed to cure the curable layer 40'a. Examples of the curing operation may include a thermal curing operation or a photo curing operation (e.g., an UV curing operation). In some embodiments, viscosity or adhesiveness of the curable layer 40'a may increase after the curing operation to facilitate the following singulation operation in FIG. 4C.

Referring to FIG. 4C, the substrate 10', the package body 14', the package body 15', and the sacrificial layer 40' are singulated or diced into a plurality of individual packages (or diced packages) in a singulation operation. In some embodiments, the singulation operation may be applied using a saw blade or laser cutting tool. In some embodiments, the singulation operation may be subsequent to a curing operation as mentioned to increase viscosity or adhesiveness of the curable layer 40'a.

After the singulation operation, each package (or diced package) includes a substrate 10, a package body 14, a package body 15, and a sacrificial layer 40. In some embodiments, a lateral surface 103 of the substrate 10, a lateral surface 143 of the package body 14, a lateral surface 153 of the package body 15, and a lateral surface (not annotated in the figures) of the sacrificial layer 40 may be substantially coplanar.

Referring to FIG. 4D, one or more of the dies from FIG. 4C may be attached to a carrier 42 through the sacrificial layer 40. In some embodiments, an adhesive layer 44 and a base film 43 may be provided on the carrier 42. In some embodiments, the sacrificial layer 40 may be in contact with the adhesive layer 44. In some embodiments, the adhesive layer 44 may include a thermal tape. The base film 43 may be a carrier for carrying the adhesive layer 44. The base film 43 may help attach the adhesive layer 44 to the carrier 42.

The sacrificial layer 40 may have a surface 401, a surface 402 opposite to the surface 401, and a sidewall 403 extending between the surface 401 and the surface 402. The surface 402 may be in contact with the adhesive layer 44. In some embodiments, the sacrificial layer 40 may be partially surrounded by the adhesive layer 44. For example, the sacrificial layer 40 may be partially in contact with the adhesive layer 44. For example, the surface 402 of the sacrificial layer 40 may be covered (such as entirely covered) in the adhesive layer 44. The surface 441 (or top surface) of the adhesive layer 44 may be higher than the surface 402 of the sacrificial layer 40. A part of the surface 441 of the adhesive layer 44 may be exposed from the one or more of the dies.

In some embodiments, the package body 15 may be spaced apart from the adhesive layer 44. For example, the surface 153 of the package body 15 may be spaced apart from the adhesive layer 44. For example, the surface 153 of the package body 15 may be not in contact with the adhesive layer 44. For example, the surface 153 of the package body 15 may be not covered by the adhesive layer 44. For example, the surface 152 of the package body 15 is raised up by the sacrificial layer 40 and is spaced apart from the surface 441 of the adhesive layer 44 by a distance "h."

In some embodiments, the substrate 10 may be spaced apart from the adhesive layer 44. For example, the surface 103 of the substrate 10 may be spaced apart from the adhesive layer 44. For example, the surface 103 of the substrate 10 may be not in contact with the adhesive layer 44. For example, the surface 103 of the substrate 10 may be not covered by the adhesive layer 44.

Referring to FIG. 4E, a conductive material may be formed on the one or more of the dies and the carrier 41, forming the conductive layer 16. As described with respect to FIG. 1A, the portion 16a of the conductive layer 16 may be disposed on the surface 141 of the package body 14. The portion 16b may be continuously disposed on the lateral surfaces of the dies. The portion 16b may be continuously disposed on the surface 143 of the package body 14, the surface 103 of the substrate 10, the surface 153 of the package body 15, and the sidewall 403 of the sacrificial layer 40. The portion 16b may be disposed on the surface 143 of the package body 14, the surface 103 of the substrate 10, the surface 153 of the package body 15, and the sidewall 403 of the sacrificial layer 40 with a substantially coplanar profile.

In some embodiments, the conductive layer 16 may also be disposed on the exposed part of the surface 441 of the adhesive layer 44. In some embodiments, since the sacrificial layer 40 is partially in contact with the adhesive layer 44, the conductive layer 16 may have a curved surface (circled in dotted line 16c) at a junction of the sidewall 403 of the sacrificial layer 40 and the surface 441 of the adhesive layer 44.

In some embodiments, since the surface 152 of the package body 15 is raised up by the sacrificial layer 40 and is spaced apart from the adhesive layer 44, the conductive layer 16 can fully cover the surface 153 of the package body 15.

In some embodiments, the conductive layer 16 may be disposed through, for example, a physical vapor deposition (PVD), such as sputter deposition or spray coating. In some embodiments, the conductive layer 16 may be disposed through a chemical vapor deposition (CVD) or plating. In some embodiments, the final structure of the conductive layer 16 disposed through sputter deposition may be similar to the semiconductor device package 1 in FIG. 1A. In some embodiments, the final structure of the conductive layer 16 disposed through spray coating may be similar to the semiconductor device package 2 in FIG. 2.

Referring to FIG. 4F, the sacrificial layer 40, the adhesive layer 44, the base film 43, and the carrier 42 may be removed from the package body 15. In some embodiments, before the removing operation, a curing operation may be performed to cure the curable layer 40a to facilitate the removing operation. In some embodiments, the curing operation may include a thermal curing operation or a photo curing operation (e.g., an UV curing operation). In some embodiments, viscosity or adhesiveness of the curable layer 40a may be decreased after the curing operation to facilitate the removing operation.

In some embodiments, since the adhesive force between the conductive layer 16 and the surface 153 is greater than the adhesive force between the conductive layer 16 and the sacrificial layer 40, the conductive layer 16 may break on the boundary of the sacrificial layer 40. After the adhesive layer 44 and the sacrificial layer 40 are removed, the conductive layer 16 may stick to the surface 153. Therefore, the burr formation can be prevented. In some embodiments, residue of the adhesive layer 44 (such as the residue 31 in FIG. 1A) may be left on the package body 15. In some embodiments, residue may be proximal to the surface 152 of the package body 15. In some embodiments, the residue 31 may in contact with the surface 152 of the package body 15. In some embodiments, the residue may be proximal to the conductive terminal 13. In some embodiments, the residue 31 may in contact with the conductive terminal 13.

The final structure may be similar to the semiconductor device package 1 in FIG. 1A.

In some embodiments where a surface treatment is performed to the surface 152 to reflow or melt the conductive terminal 13, the residue 31 of the adhesive layer 44 may be left in the recess 15r as shown in FIG. 3.

Spatially relative terms, such as "beneath," "below," "lower," "above," "upper," "left," "right" and the like, may be used herein for ease of description to describe one element or feature's relationship to another element(s) or feature(s) as illustrated in the figures. The spatially relative terms are intended to encompass different orientations of the device in use or operation, in addition to the orientation depicted in the figures. The apparatus may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

As used herein, the terms "approximately", "substantially", "substantial" and "about" are used to describe and account for small variations. When used in conduction with an event or circumstance, the terms can refer to instances in which the event or circumstance occurs precisely as well as instances in which the event or circumstance occurs to a close approximation. As used herein with respect to a given value or range, the term "about" generally means within ±10%, ±5%, ±1%, or ±0.5% of the given value or range. Ranges can be expressed herein as from one endpoint to another endpoint or between two endpoints. All ranges disclosed herein are inclusive of the endpoints unless specified otherwise. The term "substantially coplanar" can refer to two surfaces within micrometers (μm) of lying along the same plane, such as within 10 μm, within 5 μm, within 1 μm, or within 0.5 μm of lying along the same plane. When referring to numerical values or characteristics as "substantially" the same, the term can refer to the values lying within ±10%, ±5%, ±1%, or ±0.5% of an average of the values.

The foregoing outlines features of several embodiments and detailed aspects of the present disclosure. The embodiments described in the present disclosure may be readily used as a basis for designing or modifying other processes and structures for carrying out the same or similar purposes and/or achieving the same or similar advantages of the embodiments introduced herein. Such equivalent constructions do not depart from the spirit and scope of the present disclosure, and various changes, substitutions, and alterations may be made without departing from the spirit and scope of the present disclosure.

What is claimed is:

1. A method for manufacturing a semiconductor device package structure, comprising:
   providing a carrier having a first surface and a second surface opposite to the first surface;
   forming an adhesive layer on the first surface of the carrier; and
   attaching a package unit to the adhesive layer, the package unit comprising:
      a first electronic component having an active surface facing away the adhesive layer; and
      a first molding compound encapsulating the first electronic component
   wherein the adhesive layer comprises a protruding portion laterally protruding beyond a lateral surface of the package unit, and wherein the adhesive layer includes a first curve surface and a second curve surface opposite to the first curve surface.

2. The method of claim 1, wherein a center of curvature of the first curve surface is different from a center of curvature of the second curve surface.

3. The method of claim 2, wherein the protruding portion of the adhesive layer is separated from the first electronic component.

4. The method of claim 3, wherein the protruding portion of the adhesive layer has a convex surface.

5. The method of claim 1, further comprising a conductive element encapsulated by the first molding compound, wherein the conductive element overlaps the first electronic component in a direction parallel to the active surface of the first electronic component.

6. The method of claim 5, wherein the package unit further comprises a second electronic component disposed above the first electronic component, wherein a first width of the first electronic component is different from a second width of the second electronic component in a cross-sectional view.

7. The method of claim 6, wherein the second electronic component has an active surface facing toward the conductive element.

8. The method of claim 7, wherein the package unit further comprises a solder material located between the active surface of the second electronic component and the conductive element.

9. The method of claim 8, wherein the package unit further comprising a second molding compound encapsulating the second electronic component.

10. The method of claim 9, wherein a thickness of the second molding compound is different from a thickness of the first molding compound.

11. The method of claim 9, wherein the second molding compound encapsulates the solder material.

12. The method of claim 11, wherein the second molding compound is separated from the first molding compound.

13. The method of claim 6, wherein the package unit further comprises an electrical conductive structure between the first electronic component and the second electronic component.

14. A method for manufacturing a semiconductor device package structure, comprising:
   providing a carrier having a first surface and a second surface opposite to the first surface;
   forming an adhesive layer on the first surface of the carrier, wherein the adhesive layer further comprises a protruding portion tapering away from the first surface of the carrier; and
   disposing a package unit over the adhesive layer, the package unit comprising:
      a conductive element; and
      a resin layer at least partially between the adhesive layer and the conductive element, wherein the resin layer includes a curve surface between the conductive element and the adhesive layer, and wherein the resin layer horizontally overlaps the conductive element in a cross-sectional view.

15. The method of claim 14, further comprising a first electronic component covered by the resin layer.

16. The method of claim 15, further comprising a second electronic component over the resin layer, wherein the second electronic component has an active surface facing toward the conductive element.

17. A method for manufacturing a semiconductor device package structure, comprising:
   providing a carrier having a first surface and a second surface opposite to the first surface;
   forming an adhesive layer on the first surface of the carrier; and
   attaching a package unit to the adhesive layer, the package unit comprising:
      a conductive element;
      a first electronic device having an active surface facing away the adhesive layer; and
      an encapsulant encapsulating the conductive element,
   wherein the adhesive layer comprises a protruding portion protruding upwardly and covering a lateral surface of the package unit, and wherein a first elevation of a top end of the conductive element is higher than a second elevation of a top end of the protruding portion of the adhesive layer with respect to the first surface of the carrier.

18. The method of claim 17, wherein the package unit further comprises a second electronic device disposed over the conductive element, wherein a thickness of the first electronic component is different from a thickness of the second electronic component in a cross-sectional view.

19. The method of claim 18, wherein the protruding portion of the adhesive layer is separated from a lateral surface of the encapsulant.

* * * * *